United States Patent
Yang et al.

(10) Patent No.: US 9,334,444 B1
(45) Date of Patent: May 10, 2016

(54) SOROHALIDE SCINTILLATORS, PHOSPHORS, AND USES THEREOF

(71) Applicant: Sandia Corporation, Albuquerque, NM (US)

(72) Inventors: Pin Yang, Albuquerque, NM (US); Haoran Deng, Albuquerque, NM (US); F. Patrick Doty, Livermore, CA (US); Xiaowang Zhou, Livermore, CA (US)

(73) Assignee: Sandia Corporation, Albuquerque, NM (US)

( * ) Notice: Subject to any disclaimer, the term of this patent is extended or adjusted under 35 U.S.C. 154(b) by 163 days.

(21) Appl. No.: 14/177,737

(22) Filed: Feb. 11, 2014

(51) Int. Cl.
*H01L 33/50* (2010.01)
*C09K 11/85* (2006.01)
*C09K 11/77* (2006.01)
*G01T 1/20* (2006.01)
*F21K 99/00* (2016.01)

(52) U.S. Cl.
CPC ............. *C09K 11/7773* (2013.01); *F21K 9/56* (2013.01); *G01T 1/2006* (2013.01); *H01L 33/502* (2013.01)

(58) Field of Classification Search
CPC ............. C09K 11/7705; C09K 11/772; C09K 11/7773; H01L 33/502
See application file for complete search history.

(56) References Cited

U.S. PATENT DOCUMENTS

| | | |
|---|---|---|
| 5,039,858 A | 8/1991 | Anderson et al. |
| 6,437,336 B1 | 8/2002 | Pauwels et al. |
| 6,699,406 B2 | 3/2004 | Riman et al. |
| 6,818,896 B2 | 11/2004 | Pauwels et al. |
| 7,060,982 B2 | 6/2006 | Ichinose et al. |
| 7,067,815 B2 | 6/2006 | Dorenbos et al. |
| 7,067,816 B2 | 6/2006 | Dorenbos et al. |
| 7,084,403 B2 | 8/2006 | Srivastava et al. |
| 7,129,494 B2 | 10/2006 | Shah |
| 7,233,006 B2 | 6/2007 | Dorenbos et al. |
| 7,250,609 B2 | 7/2007 | Dorenbos et al. |
| 7,479,637 B2 | 1/2009 | Dorenbos et al. |
| 7,608,201 B2 | 10/2009 | Iltis |
| 7,670,578 B2 | 3/2010 | Iltis |
| 7,863,572 B1 | 1/2011 | Doty |
| 8,021,636 B2 | 9/2011 | Iltis |
| 8,252,260 B2 | 8/2012 | Iltis |
| 2013/0000698 A1* | 1/2013 | Zhou ................. G02B 5/10 136/247 |

FOREIGN PATENT DOCUMENTS

CN 102199428 * 9/2011
WO WO 2012/066425 * 5/2012

OTHER PUBLICATIONS

Translation for CN 102199428—Sep. 28, 2011.*

(Continued)

*Primary Examiner* — Carol M Koslow
(74) *Attorney, Agent, or Firm* — Helen S. Baca

(57) ABSTRACT

The present invention relates to sorohalide compounds having formula $A_3B_2X_9$, where A is an alkali metal, B is a rare earth metal, and X is a halogen. Optionally, the sorohalide includes a dopant D. Such undoped and doped sorohalides are useful as scintillation materials or phosphors for any number of uses, including for radiation detectors, solid-state light sources, gamma-ray spectroscopy, medical imaging, and drilling applications.

30 Claims, 6 Drawing Sheets

(56) References Cited

OTHER PUBLICATIONS

Aebersold et al, "Inelastic Neutron Scattering and OPtical Spectroscopy of Dy+3 Single IOns and Dimers in Cs3Y2Br9:10%Dy+3 and Cs3Dy2Br9", Inorg. Chem. vol. 33, No. 6, 1994, pp. 1133-1138.*
Hehlen et al, "Cooperative Bistability in Dense, Excited Atomic Systems", Physical Review Letters, vol. 73, No. 8, Aug. 1994, pp. 1103-1106.*
Riedener et al, "Infrared to visible upconversion in Cs3Yb2Cl9:Tm3+", Journal of Luminescence, 63, 1995, pp. 327-337.*
Luthi et al, "Near-infrared to visible upconversion in Er3+-doped Cs3Lu2Cl9, Cs3Lu2Br9 and Cs3Y2l9 excited at 1.54 um", Rhysiacl Review B, vol. 60, No. 1, Jul. 1, 1999, pp. 162-178.*
Gamelin et al, "The Role of Laser Heating in the Intrinsic Optical Bistability of Yb3+-Doped Bromide Lattices"< J. Phys. Chem. B, vol. 104, No. 47, 2000, pp. 11045-11057.*
Salley et al, "Luminescence upconversion mechanisms in Yb3+-Tb3+ systems", Journal of Luminescence, 94-95, 2001, pp. 305-309.*
Birowosuto et al, "Scintillation and luminescence propeties of Ce3+ doped ternary cesium rare-earth halides", Phys. Stat. Sol. (a), vol. 204, No. 3, Jan. 16, 2007, pp. 850-860.*
Carlin RL et al., "Superexchange interaction in dimeric $Cs_3Yb_2Br_9$," *J. Appl. Phys.* May 1990;67(9):5855-6.
Doty FP et al., "Structure and properties of lanthanide halides," *Proc. of the SPIE* 2007;6707:670705-1-670705-11.
Doty FP et al., "Elpasolite scintillators," *Sandia Technical Report SAND2012-9951*, Dec. 2012, OSTI ID: 1096473 (109 pages).
Findley KO et al., "Fracture and deformation behavior of common and novel scintillating single crystals," *Proc. of the SPIE* 2007;6707:670706-1-670706-12.
Furrer A et al., "Magnetic excitations in $Cs_2ALnX_6$ and $Cs_3Ln_2X_9$ (A =Li, Na; Ln ≡ Ce, Nd, Tb, Yb; X ≡ Cl, Br)," *J. Less-Common Metals* 1985;111:223-37.

Harrison MJ et al., "Initial investigation of strengthening agents for lanthanide halide scintillators," *Proc. of the SPIE* 2007;6707:67070B-1-67070B-10.
Hehlen MP et al., "Optical spectroscopy of the dimer system $Cs_3Yb_2Br_9$," *J. Chem. Phys.* Feb. 1993;98(3):1768-75.
Iseler GW et al., "Horizontal gradient-freeze growth of InP crystals under controlled pressure," Second International Conference of Indium Phosphide and Related Materials, 1990, pp. 25-29.
Kataoka T et al., "Yield strength and dislocation mobility of KCl-KBr solid solution single crystals," *Japan. J. of Appl. Phys.* 1977;16(7):1119-26.
Krämer KW et al., "Development and characterization of highly efficient new cerium doped rare earth halide scintillator materials," *J. Mater. Chem.* 2006;16:2773-80.
Lee W et al., "Comparative measurements on $LaBr_3(Ce)$ and $LaCl_3(Ce)$ scintillators coupled to PSPMT," *IEEE Trans. Nucl. Sci.* 2005;52(4):1119-22.
Malkin BZ et al., "EPR and optical spectra of $Yb^{3+}$ in $CsCdBr_3$: Charge-transfer effects on the energy-level structure of $Yb^{3+}$ in the symmetrical pair centers," *Phys. Rev. B* Sep. 2000;62(11):7063-70.
Meyer G, "1. Ternary chlorides and bromides of the rare earth elements," Chapter One: Solid State in *Inorganic Syntheses* 1983;22:1-10 (ed. Smith L. Holt, Jr.).
Nagarkar VV et al., "Growth and characterization of polycrystalline lanthanide halide scintillators," *Nucl. Instr. and Meth. Phys. Res. Sec. A*, 2011; 652(1):271-4.
Yang P et al., "Crystal growth and scintillation properties of $Cs_2NaGdBr_6:Ce^{3+}$," *IEEE Trans. Nucl. Sci.* Apr. 2013;60(2):1033-8.
Yang P et al., "The synthesis and structures of elpasolite halide scintillators," *Mater. Res. Soc. Symp. Proc.* 2009;1164: 1164-L11-05 (8 pages).
Ye S et al., "Phosphors in phosphor-converted white light-emitting diodes: Recent advances in materials, techniques and properties," *Mater. Sci. Eng. R*, 2010;71(1):1-34.

\* cited by examiner

US 9,334,444 B1

SOROHALIDE SCINTILLATORS, PHOSPHORS, AND USES THEREOF

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention generally relates to scintillators and phosphors, which are materials that emit light upon photoexcitation or upon exposure to ionizing radiation, as well as methods of making and using such materials.

BACKGROUND OF THE INVENTION

Scintillators and phosphors can be formed from various materials, including organic, inorganic, gaseous, glass, and/or plastic materials. In particular, inorganic scintillators offer enhanced light output and energy resolution, as compared to other materials. However, depending on its intended use, even inorganic scintillators can have limited emission spectra or optical quantum yield. For instance, broadband emission phosphors can be desirable for use in a solid-state light source, such as converting a near UV light source from a light-emitting diode (LED) to a visible white emission. In general, white LEDs are produced by mixing two or more phosphors to produce white light. For instance, a blue-emitting phosphor and a yellow-emitting phosphor are used in combination to produce a white emission. It may be desirable to have a single phosphor having a broadband emission that produces white light. In another example, high optical quantum yield is desirable in solid-state lighting and radiation detection having increased light yield and sensitivity. Thus, there is a need for additional scintillators and phosphors having enhanced optical and/or radioluminescence qualities.

SUMMARY OF THE INVENTION

The present invention focuses on a new class of lanthanide halide materials, namely sorohalides $A_3B_2X_9$ for use as advanced scintillators or phosphors for any useful application (e.g., for solid-state lighting applications). Here, A is an alkali metal (e.g., Group 1 in the IUPAC periodic table of the elements), B is a rare earth element (e.g., including lanthanides (elements 57-71 in the IUPAC periodic table of the elements), Sc, Y and Lu), and X is a halogen (e.g., Group 17 in the IUPAC periodic table of the elements). Such scintillators can be useful for, e.g., radiation detection, gamma-ray spectroscopy, phosphors for solid-state lighting, and medical imaging applications, as well as any uses described herein.

In some embodiments, the scintillation material (e.g., scintillation crystal) of the invention include dopant-activated (e.g., $Ce^{3+}$-activated) sorohalides (e.g., A is Cs and/or Rb; B is Gd-, Sc-, and/or Y-based sorohalides; and X is Cl, Br, and/or I). Herein, we provide data for scintillation characterization on photoluminescence (with quantum yield >90%) and lifetime measurement data (<50 ns) for an exemplary sorohalide having formula $Cs_3Gd_2Br_9$. In addition to this formula, other lanthanide elements from Pr to Lu can potentially be used for the same or similar applications. Furthermore, the material can include one or more alkali elements, such as Rb and Cs, as a dopant to stabilize the sorohalide structure.

Accordingly, the invention features a scintillation material of formula $A_3B_{2-i}X_9:D_i$, where A is an alkali metal, B is a rare earth metal, X is a halogen, and D is a dopant. In some embodiments, $0 \leq i < 2$. In other embodiments, $0.01 \leq i < 2$. In yet other embodiments, B and D are different.

In some embodiments, A is selected from the group of Li, Na, K, Rb, Cs, and Fr. In other embodiments, B is selected from the group of Sc, Y, La, Ce, Pr, Nd, Pm, Sm, Eu, Gd, Tb, Dy, Ho, Er, Tm, Yb, and Lu (e.g., Pr, Nd, Pm, Sm, Eu, Gd, Tb, Dy, Ho, Er, Tm, Yb, or Lu, such as Pr, Nd, or Pm). In yet other embodiments, X is selected from the group of F, Cl, Br, and I. In some embodiments, D is selected from the group of Ce (e.g., $Ce^{3+}$), Eu (e.g., $Eu^{3+}$), Yb (e.g., $Yb^{2+}$), Mn (e.g., $Mn^{2+}$), Ca, Sr, Ba, Sc, Y, Zr, Hf, Zn, Tl, Ag, Cd, Al, Ga, In, and Sn.

In some embodiments, the rare earth metal B is Gd (e.g., formula is $A_3Gd_{2-i}X_9D_i$). In further embodiments, $0 \leq i \leq 0.5$; $0 \leq i \leq 1$; $0.01 \leq i \leq 0.5$; $0.01 \leq i \leq 1$; $0.1 \leq i \leq 0.5$; $0.1 \leq i \leq 1$, or any values described herein.

In some embodiments, the rare earth metal B is Sc (e.g., formula is $A_3Sc_{2-i}X_9D_i$). In other embodiments, the rare earth metal B is Y (e.g., formula is $A_3Y_{2-i}X_9D_i$).

In other embodiments, the alkali metal A is Cs or Rb (e.g., formula is $Cs_3B_{2-i}X_9:D_i$ or $Rb_3B_{2-i}X_9D_i$). In some embodiments, the material has formula $Cs_3Gd_{2-i}X_9D_i$, $Rb_3Gd_{2-i}X_9:D_i$, $Cs_3Sc_{2-i}X_9:D_i$, $Rb_3Sc_{2-i}X_9:D_i$, $Cs_3Y_{2-i}X_9:D_i$, or $Rb_3Y_{2-i}X_9:D_i$.

In some embodiments, X is F, Cl, Br, or I. In particular embodiments, X is Cl, Br, or I. In other embodiments, X is Cl or Br. In other embodiments, X is Br (e.g., the formula is $Cs_3Gd_{2-i}Br_9:D_i$, $Rb_3Gd_{2-i}Br_9:D_i$, $Cs_3Sc_{2-i}Br_9:D_i$, $Rb_3Sc_{2-i}Br_9:D_i$, $Cs_3Y_{2-i}Br_9:D_i$, or $Rb_3Y_{2-i}Br_9:D_i$).

In some embodiments, the dopant D is Ce (e.g., formula is $A_3B_{2-i}X_9:Ce_i$). Exemplary materials include those having formula $A_3Gd_{2-i}X_9:Ce_i$, $A_3Sc_{2-i}X_9:Ce_i$, $A_3Y_{2-i}X_9:Ce_i$, $Cs_3Gd_{2-i}X_9:Ce_i$, $Rb_3Gd_{2-i}X_9:Ce_i$, $Cs_3Sc_{2-i}X_9:Ce_i$, $Rb_3Sc_{2-i}X_9:Ce_i$, $Cs_3Y_{2-i}X_9:Ce_i$, $Rb_3Y_{2-i}X_9:Ce_i$, $A_3Gd_{2-i}Br_9:Ce_i$, $A_3Sc_{2-i}Br_9:Ce_i$, $A_3Y_{2-i}Br_9:Ce_i$, $Cs_3B_{2-i}X_9:Ce_i$, $Rb_3B_{2-i}X_9:Ce_i$, $Cs_3B_{2-i}Br_9:Ce_i$, $Rb_3B_{2-i}Br_9:Ce_i$, $Cs_3Gd_{2-i}Br_9:Ce_i$, $Rb_3Gd_{2-i}Br_9:Ce_i$, $Cs_3Sc_{2-i}Br_9:Ce_i$, $Rb_3Sc_{2-i}Br_9:Ce_i$, $Cs_3Y_{2-i}Br_9:Ce_i$, or $Rb_3Y_{2-i}Br_9:Ce_i$.

In one aspect, the invention also features a radiation detector including a scintillation material of the invention (e.g., any described herein) and a photodetector configured to measure light emission from the material and to provide a detectable signal of the emission. In some embodiments, the scintillation material is of formula $A_3B_{2-i}X_9D_i$, and $0 \leq i < 2$.

In some embodiments, the photodetector includes a film, a photomultiplier tube, a photodiode, an avalanche photodiode, a microchannel plate, a photocathode, or a charge-coupled device.

In other embodiments, the radiation detector is a positron emission tomography scanner, an X-ray computed tomography scanner, a scintigraphy scanner, or a gamma camera.

In another aspect, the invention features a solid-state light source including a radiation source configured to emit radiation having at least one wavelength from about 200 nm to about 500 nm; and a scintillation material of the invention (e.g., any described herein). In some embodiments, the scintillation material is of formula $A_3B_{2-i}X_9:D_i$, and $0 \leq i < 2$. In some embodiments, the scintillation material is further configured to absorb or receive the radiation from the radiation source.

In some embodiments, the radiation source is a UV or near UV light-emitting diode. In some embodiments, the solid-state light source is configured to emit a visible white emission. In other embodiments, the solid-state light source is a white light-emitting diode.

In some embodiments, the radiation source is configured to emit radiation having at least one wavelength from about 250 nm to about 410 nm (e.g., a UV diode).

In another aspect, the invention features a system (e.g., for a white light-emitting diode), the system including a radiation source configured to emit radiation having at least one wavelength from about 200 nm to about 500 nm; and a scintillation material of the invention (e.g., any described herein). In some embodiments, the scintillation material is of formula $A_3B_{2-i}X_9:D_i$, and $0 \leq i < 2$. In some embodiments, the scintillation material is further configured to absorb or receive the radiation from the radiation source.

In yet another aspect, the invention features a method for preparing a scintillation material, the method including melt synthesis or solution-based synthesis, thereby preparing the scintillation material of the invention (e.g., where the formula is $A_3B_{2-i}X_9:D_i$). In some embodiments, $0 \leq i < 2$.

In some embodiments, the method includes melt synthesis. In further embodiments, the melt synthesis includes i) mixing a rare earth metal halide salt $BX_3$ (e.g., $BBr_3$, such as $GdBr_3$) and an alkali metal AX (e.g., ABr, such as CsBr) to form a combination, where the rare earth metal halide salt and the alkali metal can be mixed consecutively in any order or at the same time; ii) mixing dopant complex $DX_3$ (e.g., $DBr_3$, such as $CeBr_3$) in the combination; and iii) melting the combination, thereby preparing the scintillation material.

In other embodiments, the method includes solution-based synthesis. In further embodiments, the solution-based synthesis includes i) dissolving a rare earth metal halide salt $BX_3$ (e.g., $BBr_3$, such as $GdBr_3$) and an alkali metal AX (e.g., ABr, such as CsBr) in HX (e.g., HBr) to form a solution, where the rare earth metal halide salt and the alkali metal can be dissolved consecutively in any order or at the same time; ii) dissolving dopant complex $DX_3$ (e.g., $DBr_3$, such as $CeBr_3$) in the solution; iii) evaporating the solution (e.g., dehydrating the solution), thereby providing one or more hydrated crystals; and iv) treating the hydrated crystals (e.g., dehydrating the hydrated crystal(s)) to a treatment temperature below about 300° C., thereby preparing or forming the scintillation material. In other embodiments, step iii) includes slowly heating the HX solution under vacuum and with a cold trap. In some embodiments, step iv) includes the treatment temperature at about 250° C. (or about, e.g., 150° C., 175° C., 200° C., 225° C., 275°, 300° C., 325° C., or 350° C.) and a duration of at least about 6 hours (or about, e.g., 4, 5, 7, 8, 9, 10, or more hours) under vacuum and with a cold trap.

In some embodiments, step i) for any method herein includes a stoichiometry ratio of about 3:2 for $AX:BX_3$.

In some embodiments, any method herein forms the scintillation material in crystalline phase or in powder form.

In another aspect, the invention features a method for detecting radiation, the method including: exposing a scintillation material of the invention (e.g., any described herein) to radiation; and detecting light emitted from the material with a photodetector. In some embodiments, scintillation material is of formula $A_3B_{2-i}X_9:D_i$ and $0 \leq i < 2$. In further embodiments, the presence of light emitted from the material indicates or detects the presence of radiation and/or radiation source(s).

In some embodiments, the method includes use in application for gamma-ray spectroscopy, medical imaging, gas drilling, or oil drilling.

In yet another aspect, the invention features a method for producing illumination, the method including: providing a radiation source configured to emit radiation having at least one wavelength from about 200 nm to about 500 nm; and exposing a scintillation material of the invention (e.g., any described herein) to radiation, thereby resulting in the emission of illumination from the material. In some embodiments, scintillation material is of formula $A_3B_{2-i}X_9:D_i$, and $0 \leq i < 2$.

In any embodiment described herein, $0 \leq i < 2$. In some embodiments, $0.1 \leq i < 1.95$. In other embodiments, $0.01 \leq i < 2$. Exemplary values for i include about $0 \leq i < 2$, $0 \leq i \leq 1.95$, $0 \leq i \leq 1.5$, $0 \leq i \leq 1$, $0 \leq i \leq 0.5$, $0 \leq i \leq 0.1$, $0.01 \leq i \leq 2$, $0.01 \leq i \leq 1.95$, $0.01 \leq i \leq 1.5$, $0.01 \leq i \leq 1$, $0.01 \leq i \leq 0.5$, $0.01 \leq i \leq 0.1$, $0.05 \leq i \leq 2$, $0.05 \leq i \leq 1.95$, $0.05 \leq i \leq 1.5$, $0.05 \leq i \leq 1$, $0.05 \leq i \leq 0.5$, $0.05 \leq i \leq 0.1$, $0.1 \leq i < 2$, $0.1 \leq i \leq 1.95$, $0.1 \leq i \leq 1.5$, $0.1 \leq i \leq 1$, $0.1 \leq i \leq 0.5$, $0.2 \leq i < 2$, $0.2 \leq i \leq 1.95$, $0.2 \leq i \leq 1.5$, $0.2 \leq i \leq 1$, or $0.2 \leq i \leq 0.5$.

In any embodiment described herein, the material further includes one or more co-dopants (e.g., any dopant or co-dopant described herein).

In any embodiment described herein, B and D are different.

In any embodiment described herein, the scintillation material is in crystalline phase or in powder form.

In any embodiment described herein, the material has a quantum yield greater than about 90% (e.g., from about 90% to 93%, 90% to 95%, 90% to 98%, 90% to 99%, 91% to 93%, 91% to 95%, 91% to 98%, 91% to 99%, 93% to 95%, 93% to 98%, 93% to 99%, 95% to 98%, or 95% to 99%, etc.). In some embodiments, the material has a quantum yield from about 50% to 99% (e.g., from 50% to 95%, 50% to 85%, 50% to 80%, 50% to 75%, 60% to 99%, 60% to 95%, 60% to 85%, 60% to 80%, 60% to 75%, 70% to 99%, 70% to 95%, 70% to 85%, 70% to 80%, 70% to 75%, 75% to 99%, 75% to 95%, 75% to 85%, 75% to 80%, 80% to 99%, 80% to 95%, 80% to 85%, 90% to 99%, 90% to 95%, or 95% to 99%). In particular embodiments, the material has a quantum yield from about 75% to 99%.

In any embodiment described herein, the material has at least one lifetime decay component (e.g., the fasted lifetime decay component) of less than about 50 ns (e.g., from about 10 ns to 20 ns, 10 ns to 30 ns, 10 ns to 40 ns, 10 ns to 50 ns, 20 ns to 30 ns, 20 ns to 40 ns, 20 ns to 50 ns, 30 ns to 40 ns, 30 ns to 50 ns, or 40 ns to 50 ns).

In any embodiment described herein, the material has a broadband emission spectrum (e.g., an ionization emission spectrum with one or more peaks, each peak is independently from about 250 nm to 700 nm (e.g., from about 275 nm to 700 nm, 300 nm to 700 nm, 325 nm to 700 nm, 350 nm to 700 nm, 250 nm to 650 nm, 275 nm to 650 nm, 300 nm to 650 nm, 325 nm to 650 nm, 350 nm to 650 nm, 250 nm to 600 nm, 275 nm to 600 nm, 300 nm to 600 nm, 325 nm to 600 nm, 350 nm to 600 nm, 250 nm to 550 nm, 275 nm to 550 nm, 300 nm to 550 nm, 325 nm to 550 nm, 350 nm to 550 nm, 250 nm to 500 nm, 275 nm to 500 nm, 300 nm to 500 nm, 325 nm to 500 nm, or 350 nm to 500 nm); and/or a photoemission spectrum with a peak at about 450 nm, 500 nm, or 550 nm). In other embodiments, the material further includes sufficient red contribution (e.g., emission of at least one wavelength that is more than about 450 nm, 500 nm, 550 nm, or 600 nm, such as from about 450 nm to 700 nm (e.g., from about 450 nm to 500 nm, 450 nm to 550 nm, 450 nm to 600 nm, 450 nm to 650 nm, 500 nm to 550 nm, 500 nm to 600 nm, 500 nm to 650 nm, 500 nm to 700 nm, 550 nm to 600 nm, 550 nm to 650 nm, 550 nm to 700 nm, 600 nm to 650 nm, or 600 nm to 700 nm). The photoexcitation spectrum of $Ce^{3+}$-doped $Cs_3Gd_2Br_9$ shows many $Gd^{3+}$ 5d-to-4f transitions and a major excitation band peaked at about 348 nm (e.g., from about 300 nm to 420 nm, such as from 300 nm to 400 nm, 300 nm to 350 nm, 325 nm to 420 nm, 325 nm to 400 nm, or 325 nm to 350 nm). Under ionization excitations, this material shows a broad emission peak centered at about 499 nm and spanning from about 350 nm to 700 nm.

In any embodiment described herein, the material is a single phase compound.

In any embodiment described herein, the material has a rhombohedral and/or a hexagonal structure.

In any embodiment described herein, the rare earth metal B is selected from the group of Gd, Sc, Y, Pr, Nd, Pm, Sm, Eu, Tb, Dy, Ho, Er, Tm, Yb, and Lu (e.g., Pr, Nd, Gd, or others).

In any embodiment described herein, the alkali metal A is K, Cs, or Rb.

In any embodiment described herein, the dopant D includes Ce (e.g., $Ce^{3+}$), Eu (e.g., $Eu^{2+}$ or $Eu^{3+}$), Yb (e.g., $Yb^{2+}$ or $Yb^{3+}$), and Mn (e.g., $Mn^{2+}$). In some embodiments, the material includes a dopant (e.g., Ce) and a co-dopant (e.g., Mn).

DEFINITIONS

By "about" is meant +/−10% of any recited value. As used herein, this term modifies any recited value, range of values, or endpoints of one or more ranges.

Other features and advantages of the invention will be apparent from the following description and the claims.

DETAILED DESCRIPTION OF THE INVENTION

Figure 1:
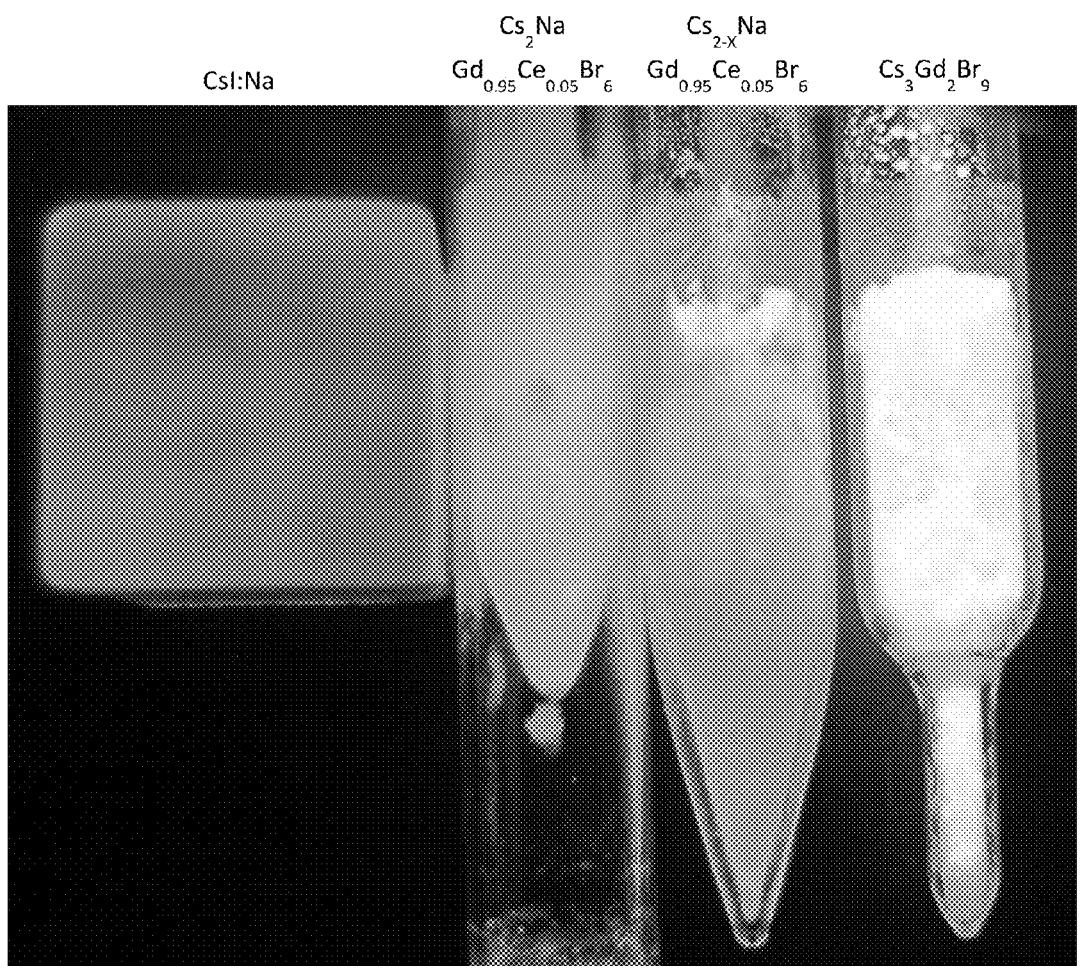
FIG. 1 is a photograph showing light emission under UV excitation. The following crystals are shown from left to right: the CsI:Na scintillator, which is an industry workhorse; a $Cs_2NaGd_{0.95}Ce_{0.05}Br_6$ scintillator, which is an elpasolite halide ($Cs_2NaGdBr_6$) with a $Ce^{3+}$ activator at 5 mol. %; a $Cs_{2-x}NaGd_{0.95}Ce_{0.05}Br_6$ scintillator (where x indicates a deviation from stoichiometry); and the new $Cs_3Gd_2Br_9$ sorohalide compound.

The present invention relates to sorohalides (e.g., $A_3B_2X_9$) and includes doped forms thereof. In some examples, the sorohalide has the formula $A_3B_{2-i}X_9D_i$, where D is the dopant and where i is a number reflecting the stoichiometry of dopant D in the crystal lattice and the substitution of rare earth metal B by dopant D in this lattice.

Scintillation Material

The scintillation materials of the invention include those having the formula $A_3B_{2-i}X_9:D_i$, where A is an alkali metal, B is a rare earth metal, X is a halogen, and D is a dopant; and where $0 \leq i < 2$. In some embodiments, $0.01 \leq i < 2$. In other embodiments, B and D are different.

The material can have any useful form. For instance and without limitation, this material can be a crystal, such as a single crystal (e.g., a large single crystal) or a small crystal, or a powder. In addition, the material can be in polycrystalline or monocrystalline form. In some embodiments, the material is in powder form (e.g., in phosphor or solid-state lighting applications). In other embodiments, the material has a single phase.

The material can have any useful property. For instance and without limitation, the material has at least one lifetime decay component (e.g., the fastest lifetime decay component) that is less than about 35 ns (e.g., less than about 40 ns, 45 ns, 50 ns, 55 ns, 60 ns, or 65 ns). In other embodiments, the material has at least three lifetime decay components, where at least one is less than about 35 ns. In some embodiments, the material has at least three lifetime decay components, where one is less than about 35 ns and/or less than about 150 ns and/or less than about 600 ns. In other embodiments, the material has a quantum yield greater than about 90%.

In other embodiments, the material has a maximum emission spectrum having a peak at about 500 nm (e.g., at about 500 nm, 460 nm, 470 nm, 480 nm, 490 nm, 500 nm, 510 nm, 520 nm, or 530 nm). In yet other embodiments, the material has a doubled ionization emission peak at about 310 nm and about 390 nm (e.g., at about 312 nm and about 391 nm). In some embodiments, the material has at least three peaks in the excitation spectrum, where a first peak is at about 275 nm, a second peak is at about 310 nm, and a third peak is at about 348 nm. In other embodiments, the material has an excitation spectrum of sufficient red contribution (e.g., at least one peak having a wavelength that is more than about 500 nm, 550 nm, 550 nm, or 600 nm).

Dopants

The materials of the invention can optionally include one or more dopants or activators. Without wishing to be limited by theory, the dopant D generally substitutes the rare earth metal B in the crystal lattice to form crystal defects or to form additional energy states within the host crystal band gap. These defects and energy states create electronic levels that are generally forbidden and, thus, allow for additional emission peaks, as compared to a material lacking the dopant. Even if the sorohalide is an inherent or intrinsic scintillator without the dopant, inclusion of one or more dopants can enhance optical output and alter the emission spectra. For instance and without limitation, the sorohalide $Cs_3Gd_2Br_9$ is an intrinsic scintillator and phosphor, and can optionally include one or more dopants. Accordingly, the type and concentration of the dopant can play a key role for the performance of scintillators or phosphors and can be modified to optimize the efficiency, performance, and chromaticity of the sorohalides of the invention.

Exemplary dopants include Ce (e.g., $Ce^{3+}$), Eu (e.g., $Eu^{3+}$), Yb (e.g., $Yb^{2+}$), and Mn (e.g., $Mn^{2+}$). In some embodiments, the material includes a dopant (e.g., Ce) and a co-dopant (e.g., Mn). In other embodiments, D is selected from the group consisting of Ca, Sr, Ba, Sc, Y, Zr, Hf, Zn, Tl, Ag, Cd, Al, Ga, In, and Sn. In some embodiments, the dopant and/or co-dopants, if present, are added in an amount from about 0.01 mol. % to 3.0 mol. % in the final material (e.g., from about 0.01 mol. % to 1.0 mol. %, 0.01 mol. % to 1.5 mol. %, 0.01 mol. % to 2.0 mol. %, 0.01 mol. % to 2.5 mol. %, 0.03 mol. % to 1.0 mol. %, 0.03 mol. % to 1.5 mol. %, 0.03 mol. % to 2.0 mol. %, 0.03 mol. % to 2.5 mol. %, 0.03 mol. % to 3.0 mol. %, 0.05 mol. % to 1.0 mol. %, 0.05 mol. % to 1.5 mol. %, 0.05 mol. % to 2.0 mol. %, 0.05 mol. % to 2.5 mol. %, 0.05 mol. % to 3.0 mol. %, 0.1 mol. % to 1.0 mol. %, 0.1 mol. % to 1.5 mol. %, 0.1 mol. % to 2.0 mol. %, 0.1 mol. % to 2.5 mol. %, 0.1 mol. % to 3.0 mol. %, 0.15 mol. % to 1.0 mol. %, 0.15 mol. % to 1.5 mol. %, 0.15 mol. % to 2.0 mol. %, 0.15 mol. % to 2.5 mol. %, 0.15 mol. % to 3.0 mol. %, 0.2 mol. % to 1.0 mol. %, 0.2 mol. % to 1.5 mol. %, 0.2 mol. % to 2.0 mol. %, 0.2 mol. % to 2.5 mol. %, 0.2 mol. % to 3.0 mol. %, 0.3 mol. % to 1.0 mol. %, 0.3 mol. % to 1.5 mol. %, 0.3 mol. % to 2.0 mol. %, 0.3 mol. % to 2.5 mol. %, or 0.3 mol. % to 3.0 mol. %).

In yet other embodiments, the dopant and/or co-dopants, if present, are added in an amount that does not induce optical quenching (e.g., thereby reducing light output). In particular embodiment, one or more dopants and/or co-dopants are used to further red shift the emission spectra of the material (e.g., by using an Eu dopant).

Such dopants can be present in any useful amount. For formula $A_3B_{2-i}X_9:D_i$, i represent the stoichiometric amount of D in the material. In some embodiments, i is from about 0.01 to 1.95 (e.g., from about 0.01 to 0.25, 0.01 to 0.5, 0.01 to 0.75. 0.01 to 1, 0.01 to 1.25, 0.01 to 1.5, 0.01 to 1.75, 0.05 to 0.25, 0.05 to 0.5, 0.05 to 0.75. 0.05 to 1, 0.05 to 1.25, 0.05 to 1.5, 0.05 to 1.75, 0.05 to 1.95, 0.1 to 0.25, 0.1 to 0.5, 0.1 to 0.75. 0.1 to 1, 0.1 to 1.25, 0.1 to 1.5, 0.1 to 1.75, 0.1 to 1.95, 0.2 to 0.25, 0.2 to 0.5, 0.2 to 0.75. 0.2 to 1, 0.2 to 1.25, 0.2 to 1.5, 0.2 to 1.75, 0.2 to 1.95, 0.3 to 0.5, 0.3 to 0.75. 0.3 to 1, 0.3 to 1.25, 0.3 to 1.5, 0.3 to 1.75, 0.3 to 1.95, 0.4 to 0.5, 0.4 to 0.75. 0.4 to 1, 0.4 to 1.25, 0.4 to 1.5, 0.4 to 1.75, 0.4 to 1.95, 0.5 to 0.75. 0.5 to 1, 0.5 to 1.25, 0.5 to 1.5, 0.5 to 1.75, 0.5 to 1.95, 0.6 to 0.75. 0.6 to 1, 0.6 to 1.25, 0.6 to 1.5, 0.6 to 1.75, 0.6 to 1.95, 0.7 to 0.75. 0.7 to 1, 0.7 to 1.25, 0.7 to 1.5, 0.7 to 1.75, 0.7 to 1.95, 0.8 to 1, 0.8 to 1.25, 0.8 to 1.5, 0.8 to 1.75, 0.8 to 1.95, 0.9 to 1, 0.9 to 1.25, 0.9 to 1.5, 0.9 to 1.75, 0.9 to 1.95, 1 to 1.25, 1 to 1.5, 1 to 1.75, 1 to 1.95, 1.1 to 1.25, 1.1 to 1.5, 1.1 to 1.75, 1.1 to 1.95, 1.2 to 1.25, 1.2 to 1.5, 1.2 to 1.75, 1.2 to 1.95, 1.3 to 1.5, 1.3 to 1.75, 1.3 to 1.95, 1.4 to 1.5, 1.4 to 1.75, 1.4 to 1.95, 1.5 to 1.75, 1.5 to 1.95, 1.6 to 1.75, 1.6 to 1.95, 1.7 to 1.75, 1.7 to 1.95, 1.8 to 1.95, and 1.9 to 1.95).

Furthermore, dopants can be included in the material in any useful manner, as described herein. In addition, a skilled artisan would understand that the amount and manner of adding the dopant can be optimized in any useful manner. For instance, the amount of the dopant complex (e.g., $DX_3$) added during synthesis should be about the same as the desired stoichiometry of D in the final sorohalide material. Without wishing to be limited by theory, the amount of dopant within the lattice may be limited by the ionic size of the dopant and the rare earth metal in the lattice structure. For instance and without limitation, as the ionic size of a lanthanide ion and dopant Ce is similar, the $Ce^{3+}$ ion can substitute about 50% of the $Ln^{3+}$ ions in the host lattice. In contrast, this limit may be difficult for when there is a mismatch in the ionic radius between the dopant and the rare earth metal in the host lattice (e.g., mismatch in the radius between D and B in $A_3B_{2-i}X_9$: $D_i$). For instance, the solubility range for Pr, Nd, and/or Pm may be less than that of Ce, thereby limiting the amount of dopant that can be dissolved in solution and/or added to the host lattice.

Methods of Synthesis

The scintillation materials of the invention can be synthesized by any useful method. Exemplary methods include a solid-state reaction (e.g., a reaction between one or more powders in the solid state), which can optionally be optimized to have a low calcination temperature (e.g. below about 250° C.); a melt synthesis (e.g., using the Bridgman method); a solution-based synthesis (e.g., using wet-chemical methods, such as by using metal-acid reaction, salt-acid reactions, hydrothermal reactions, sol-gel reactions, chemical co-precipitation, combustion, and/or spray pyrolysis); and/or a vapor deposition synthesis, such as a hot wall evaporation (HWE) method. The materials can be of any useful form, such as a single crystal or a powder. Any of these steps can further include vacuum dehydration (e.g., heating to 200° C. under vacuum to remove residual hydrates), cutting or shaping the crystal to the desired final dimension, and/or sanding or polishing the crystal (e.g., with alumina).

In one embodiment, the sorohalide of the invention is prepared by a direct melting process using stoichiometric amounts of halide salts, e.g., AX, $DX_3$, and/or $BX_3$ in powder and/or bead form. In one non-limiting example, the sorohalide $Cs_3Gd_{2-i}Br_9:Ce_i$ was prepared by a direct melting process using stoichiometric amounts of CsBr, $CeBr_3$, and $GdBr_3$ (e.g., a stoichiometric ratio of about 3:2 for CsBr: $GdBr_3$). About 5 mol. % of $CeBr_3$ was added to substitute $Gd^{3+}$ in the compound lattice as a scintillating activator or dopant. Of course, a skilled artisan would understand that the mol. % of the dopant complex $DX_3$ could be optimized (e.g., using any mol. % or range described herein) to obtain the desired doping. The starting anhydrous compounds (>99.99%) were mixed and loaded into an ampoule (e.g., fused quartz ampoules) in an inert atmosphere (e.g., an argon-filled glovebox). The ampoule was vacuum sealed before melting in a box furnace. Using this method, a single crystal of $Cs_3Gd_{1.9}Ce_{0.1}Br_9$ was grown by a vertical Bridgman method. When powders are formed after the Bridgman method, polycrystalline scintillators or phosphor components can be formed by hot pressing (e.g., consolidating the powder) or hot forging (e.g., deforming and further densifying the melt ingot). Methods of forming sorohalides are described in, e.g., Meyer G, "1. Ternary chlorides and bromides of the rare earth elements," Chapter One: Solid State in *Inorganic Syntheses* 1983; 22:1-10 (ed. Smith L. Holt, Jr.), which is incorporated herein by reference in its entirety.

In particular, the benefit of halide salts includes ease of use, including easy dissolution of these salts in aqueous solution and simplified mixing of the solutions with a precise control of stoichiometry. Furthermore, in some instances, the sorohalides can be formed by vacuum dehydration following by thermal treatment below 250° C., as well as at or below about 70% (e.g., below about 90%, 85%, 80%, 75%, 70%, 65%, 60%, 55%, 50%, 45%, or less) of the highest melting point of the initial salt for a solid-state reaction. Such a reduced thermal treatment would be beneficial to significantly reduce manufacturing cost, as most highly efficient traditional phosphors are prepared by using high temperature calcination processes.

Methods of forming elpasolites are described in, e.g., Doty F P et al., "Elpasolite scintillators," *Technical Report SAND*2012-9951, December 2012, OSTI ID: 1096473 (109 pages); Yang P et al., "Crystal growth and scintillation properties of $Cs_2NaGdBr_6:Ce^{3+}$," *IEEE Trans. Nucl. Sci.* 2013 April; 60(2):1033-8; and Yang P et al., "The synthesis and structures of elpasolite halide scintillators," *Mater. Res. Soc. Symp. Proc.* 2009; 1164: 1164-L11-05 (8 pages), each of which is incorporated herein by reference in its entirety. These methods can be optimized (e.g., by modifying the stoichiometric ratio of the initial components AX, $DX_3$, and $BX_3$) to form the sorohalides of the invention.

In another embodiment, the sorohalide of the invention is formed by using solution-based synthesis. For instance, these sorohalide compounds can be formed by slow evaporation from a HX acid (e.g., a hydrobromic acid). In this exemplary process, high purity CsBr, GdBr$_3$, and CeBr$_3$ can be dissolved in HBr solution (e.g., in a stoichiometric ratio of about 3:2 for CsBr:GdBr$_3$). The dopant complex CeBr$_3$ can be included at the desired ratio (e.g., any useful mol. %, such as those described herein). Then, the resultant solution can be dried and coated on a substrate (e.g., a glass substrate, such as a glass tube or glass panel, depending on the application) under mild heating in a vacuum or in an inert atmosphere (e.g., in an N$_2$- or Ar-filled glovebox). This drying or dehydrating step can optionally include slowly heating the HX solution. In some embodiments, the HX solution (e.g., HBr or HCl solution) is slowly heated and dried in a Schlenk flask with a vacuum pump (e.g., better or less than $10^{-3}$ torr) and a cold trap (e.g., a liquid nitrogen cold trap) to trap HX and any other corrosive vapors. In other embodiments, the method includes treating the dehydrated solution to a treatment temperature below about 300° C. (e.g., at about 250° C.). In further embodiments, this treating step includes exposure to the treatment temperature for at least about 6 hours. This process has been demonstrated for some elpasolite halides, such as Cs$_2$KTbCl$_6$ and Cs$_2$KEuCl$_6$ (see, e.g., Villafuerte-Castrejon M E et al., "Crystal Structure of Cs$_2$KTbCl$_6$ and Cs$_2$KEuCl$_6$ by Powder X-Ray Diffraction," *J. Solid State Chem.* 1997; 132(1):1-5, which is incorporated herein by reference in its entirety).

In other embodiments, the HWE method is used, where this vapor deposition technique relies on partial pressures of constituent materials. This method can allow for the formation of unconventional compositions doped with various amounts of Ce$^{3+}$ and one or more other co-dopants.

The dopant D (e.g., in the form of the dopant complex DX$_3$) can be included in any useful amount (e.g., any described herein). In some embodiments, about 2.5 mol. %, 5 mol. %, 7.5 mol. %, or 50 mol. % of dopant is added to substitute in the compound lattice as an activator.

A skilled artisan would understand how to modify or optimize any of these synthetic methods to obtain the materials of the invention. For instance, the following parameters can be altered: substrate temperature and constituent evaporation rates (e.g., for a vapor deposition technique), substrate type (e.g., quartz, glass, etc.), etc. (see, e.g., Nagarkar V V et al., "Growth and characterization of polycrystalline lanthanide halide scintillators," *Nucl. Instr. and Meth. Phys. Res. Sec. A*, 2011; 652(1):271-4, which is incorporated herein by reference in its entirety).

The materials of the invention can be characterized by any useful methodology. Exemplary methods include determining film or particle morphology (e.g., using a scanning electron microscope or powder x-ray diffraction), assessing scintillation performance (e.g., using pulse height analysis with a photomultiplier tube (PMT)), obtaining energy, photoexcitation, photoemission, or radioluminescence spectra (e.g., by using a fluorometer and an arc lamp; using a x-ray generator in combination with a monochromator, a cathodoluminescence measurement system, an ion beam accelerator, a PMT, and a photocathode; or using PMT setup and exposing them to 241Am (60 keV), 122Co (122 keV), 22Na (511 keV, 1.2 MeV), and 137Cs (662 keV) radioisotopes), recording decay time (e.g., using a gamma-ray excitation (22Na source) using the coincident technique), and/or detecting thermal events during synthesis and melting (e.g., using a differential calorimeter). Additional methodologies are described in, e.g., Doty F P et al., "Elpasolite scintillators," *Technical Report SAND*2012-9951, December 2012, OSTI ID: 1096473, 109 pages; Malkin B Z et al., "EPR and optical spectra of Yb$^{3+}$ in CsCdBr$_3$: Charge-transfer effects on the energy-level structure of Yb$^{3+}$ in the symmetrical pair centers," *Phys. Rev. B* 2000 September; 62(11):7063-70; Carlin R L et al., "Superexchange interaction in dimeric Cs$_3$Yb$_2$Br$_9$," *J. Appl. Phys.* 1990 May; 67(9):5855-6; and Hehlen M P et al., "Optical spectroscopy of the dimer system Cs$_3$Yb$_2$Br$_9$," *J. Chem. Phys.* 1993 February; 98(3):1768-75, each of which is incorporated herein by reference in its entirety.

Uses

The materials of the invention can be configured for any beneficial use. In one embodiment, the material is a scintillator that converts incident radiation into light emission. Accordingly, the material would find uses in methods and apparatuses for measuring radiation detection. In another instance, light emission from the material can be used as a light source (e.g., a solid-state light source). In some non-limiting embodiments, such methods and apparatuses are beneficial for any use requiring high luminosity, good energy resolution, excellent proportionality, exceptional optical quantum yields, and/or short decay times. Other uses are described herein.

The materials of the invention can be configured as a radiation detector. As described herein, the materials of the invention emit light upon exposure to such radiation. Thus, a radiation detector can be made, e.g., by coupling the material with a component for detecting the light produced by the material when it interacts or "scintillates" when exposed to a radiation source. In some embodiments, the radiation detector includes a window that transmits a radiation signal to be detected, a scintillation material (e.g., any described herein) configured to receive the radiation signal, and a photodetector configured to measure the resultant emission from the scintillation material upon being exposed to the radiation signal. The radiation detector can be used to measure various kinds of radiation, including near UV excitation, UV excitation, X-rays, gamma-rays, cosmic rays, and particles characterized by an energy level of greater than about 1 keV.

In some embodiments, the radiation detector includes the material of the invention and a photodetector configured to measure light emission from the material and to provide a detectable signal of the emission. Exemplary photodetectors include a film, a photomultiplier tube (PMT, e.g., a solid-state PMT or a position sensitive PMT), a photodiode (e.g., an avalanche photodiode (APD), such as a silicon carbide APD, or a hybrid photodiode), a microchannel plate, a photocathode, a charge-coupled device (CCD), etc. Such photodetectors can be provided in any useful form, such as an array.

In particular embodiments, the radiation detector further includes an optical coupler (e.g., configured to deliver light from the scintillation material to the photodetector) and/or an optical window (e.g., configured to deliver light from the optical coupler to the photodetector). In some embodiments, the radiation detector further includes a reference light source (e.g., configured to stabilize gain, where the reference light source is optionally a solid-state light source including the material of the invention).

Additional components may also be present. For instance, a reflector material can be placed between the scintillator and a housing for the scintillation material. In another instance, the housing can include a sample holder (e.g., to contain a test sample), a shield (e.g., a magnetic light shield configured to surround the housing and/or sample holder to minimize radiation exposure to a user of the detector), one or more dynodes, a collector (e.g., configured to accumulate light and/or electrons), and/or one or more resistors. The radiation detector can further include electronics (e.g., one or more of a preamplifier, an amplifier, a high voltage source (e.g., to provide power to one or more electronic components), a voltage divider, a dynode tap, an oscilloscope, a scaler, a discriminator, a multi-channel analyzer, a power source, a digital counter, a coincidence circuit, a pulse analyzer, and/or a circuit to process the electrical signal from a photodetector and measure the height, width, and/or frequency of the electrical signal).

These components can be arranged in any useful way. For instance, the material, photodetector, and optical coupler can be integrated within a housing (e.g., a hermetically sealed housing, such as for a hygroscopic crystal). In other embodiments, one or more components (e.g., any described herein) are provided in an integrated assembly.

The material can be employed in methods for detecting radiation. Such methods can include exposing the material of the invention to radiation and detecting light emitted from the material with a photodetector (e.g., any described herein).

Such methods and apparatuses can be useful in various fields, such as for spectroscopy (e.g., gamma-ray spectroscopy), medical imaging, and/or drilling applications (e.g., downhole gas drilling or oil drilling). Accordingly, the methods and apparatuses can be adapted for any of these particular uses. For instance, for use in medical imaging, the radiation detector can be configured for medical imaging, such as in radiography, fluoroscopy, gamma-ray spectroscopy (e.g., using a gamma camera of the Anger type), scintigraphy, X-ray computed tomography (CT), positron emission tomography (PET), single-photon emission computed tomography (SPECT), etc.

In another instance, for drilling uses, the material includes a housing configured to surround the scintillation material and to withstand various types of operating environments (e.g., high temperature, high vibration, high shock, etc.). In some embodiments, the housing includes a seal that is configured to maintain the scintillation material under compression. In yet other embodiments, the housing includes a window (e.g., a titanium housing with a sapphire window) configured to allow for maximum transmission from the scintillation material.

Alternatively, the materials of the invention can be used in a solid-state light source. The solid-state light source can include a radiation source (e.g., a light-emitting diode, such as a GaInAlN diode or an InGaN diode) and a crystal or powder of the invention (e.g., configured to receive a radiation emission from the radiation source). The radiation source can emit any useful wavelength of radiation that can cause photoexcitation of the material of the invention (e.g., a radiation having at least one wavelength from about 200 nm to about 500 nm, including any range described herein). The radiation source can be any useful source, such as a light-emitting diode (e.g., including at least one semiconductor layer selected from the group GaN, ZnSe, and SiC; and at least one active region comprising a p-n junction selected from the group GaN, AlGaN, InGaN, and InAlGaN). Methods of making and testing solid-state light sources are described, e.g., in Ye S et al., "Phosphors in phosphor-converted white light-emitting diodes: Recent advances in materials, techniques and properties," *Mater. Sci. Eng. R,* 2010; 71(1):1-34, which is incorporated herein by reference in its entirety. In some embodiments, the solid-state light source is a white light-emitting diode (LED).

Figure 2:
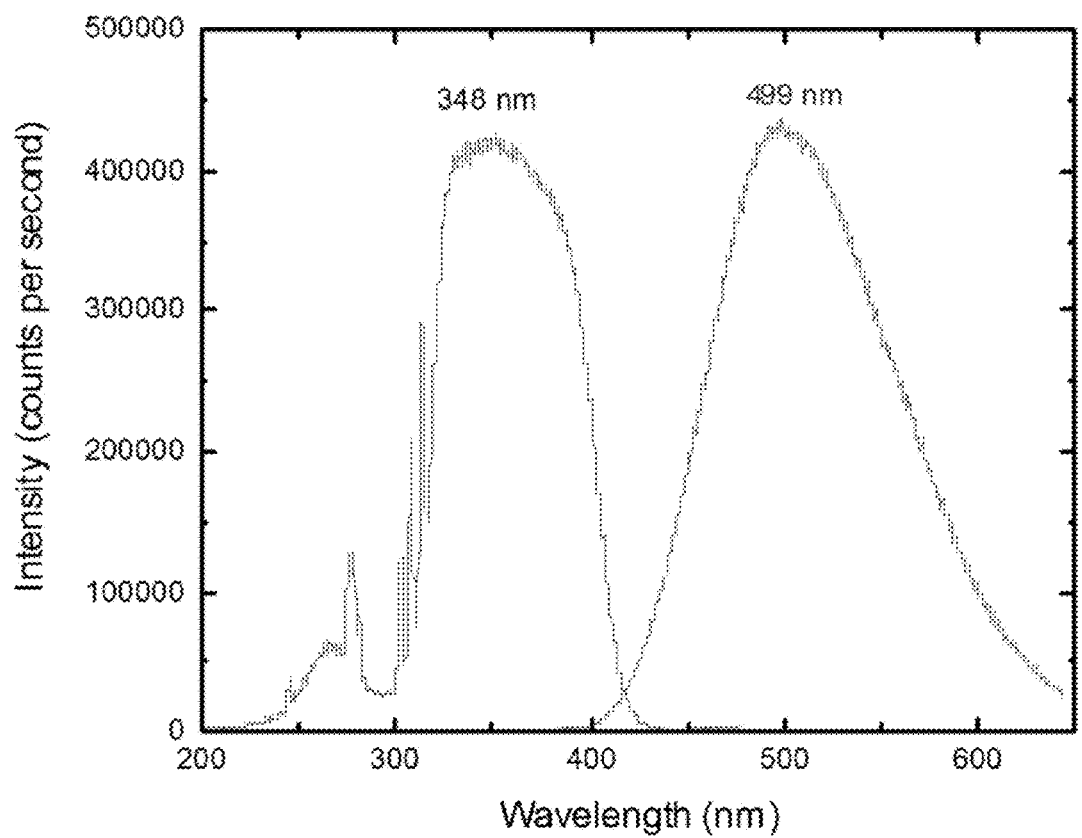
FIG. 2 shows photoexcitation and photoemission responses for the $Cs_3Gd_2Br_9$ sorohalide scintillator in powder form. Provided are excitation (peak at 348 nm) and emission (peak at 499 nm) spectra. As compared to the elpasolite scintillator shown in FIG. 3, the sorohalide material emits a red-shifted peak at 499 nm. This figure suggests that the sorohalides of the invention can be useful for phosphor applications (e.g., for solid-state lighting).

Such light sources can be configured in any useful way. In the industry, mixed phosphors are generally used to obtain a white light source. For example, two or three phosphors are combined, such that the combined emission of these multiple phosphors provides the appropriate emission. For instance, a red phosphor (e.g., $Eu^{2+}$ based phosphors) are compensated by yellow phosphors (e.g., $Y_3Al_5O_{12}:Ce^{3+}$ YAG:Ce phosphor) to produce a white source. However, such mixed phosphor systems generally exhibit diminished quantum efficiency due to reabsorption and increased color aberration. In another approach, co-activated phosphors using energy transfer through down conversion (e.g., such as in $Ce^{3+}/Mn^{2+}$, $Eu^{2+}/Mn^{2+}$, or $Ce^{3+}/Eu^{2+}$ systems) are used to provide white source, which provides provide better color rending as compared to mixed phosphor systems. Still, these co-activated systems generally exhibit decreased total luminous efficiency and longer lifetimes. In contrast, the present scintillation materials can be used in a single phase white-emitting phosphor. For example, as shown in FIGS. 1 and 2, the emission of an exemplary crystal exhibits high optical quantum yield (e.g., from about 91% to 94%) of the appropriate emission spectra having broadband emission (e.g., from 350 nm to 700 nm, with a sufficient red contribution). These characteristics have outperformed commercial phosphors that are currently used in the phosphor-converted white light-emitting diodes through the use of mixed phosphors or co-activated phosphors. In addition, the materials of the invention could, e.g., possess increased efficiency (e.g., by no energy redistribution), which can provide reduced color aberration, increased color rending, and potential low cost in manufacturing. Accordingly, the invention also includes a single phosphor system for a white light-emitting diode including any scintillation material described herein.

The solid-state light source can include any additional components, such as a light conversion layer (e.g., located on the top side of a radiation source and including the material of the invention), one or more polymers (e.g., an organic silicon polymer), a lens cover (e.g., configured to gather light from the conversion layer), etc.

The materials of the invention can also be useful for methods of producing illumination. Such methods include providing a radiation source (e.g., configured to emit radiation having at least one wavelength from about 200 nm to about 500 nm) and exposing a material of the invention, thereby resulting in the emission of illumination from the material.

Exemplary other uses, as well as methods of making and testing scintillators, are further described in U.S. Pat. Nos. 7,067,815; 7,067,816; 7,608,201; 7,670,578; 7,863,572; 8,021,636; and 8,252,260; Ye S et al., "Phosphors in phosphor-converted white light-emitting diodes: Recent advances in materials, techniques and properties," *Mater. Sci. Eng. R,* 2010; 71(1):1-34; Yang P et al., "Crystal growth and scintillation properties of $Cs_2NaGdBr_6:Ce^{3+}$," *IEEE Trans. Nucl. Sci.* 2013 April; 60(2):1033-8; and Yang P et al., "The synthesis and structures of elpasolite halide scintillators," *Mater. Res. Soc. Symp. Proc.* 2009; 1164: 1164-L11-05 (8 pages), each of which is incorporated herein by reference in its entirety.

EXAMPLES

Example 1

Synthesis of Sorohalide Scintillator Including $Cs_3Gd_2Br_9$

We prepared an exemplary cerium-doped gadolinium-based sorohalide, $Cs_3Gd_2Br_9:Ce^{3+}$. The sorohalide was prepared by direct melting process using stoichiometric amount of CsBr, $CeBr_3$, and $GdBr_3$. About 5 mol. % of $CeBr_3$ was added to substitute $Gd^{3+}$ in the compound lattice as a scintillating activator or dopant. The starting anhydrous compounds (>99.99%) obtained from Sigma-Aldrich were mixed and loaded into a quartz ampoule in an argon filled glovebox. The ampoule was vacuum sealed before melting in a box furnace. A single crystal of $Cs_3Gd_{1.9}Ce_{0.1}Br_9$ was grown by a vertical Bridgman method, using the preparation procedure as provided Yang P et al., "Crystal growth and scintillation properties of $Cs_2NaGdBr_6:Ce^{3+}$," *IEEE Trans. Nucl. Sci.* 2013 April; 60(2):1033-8. The performance and characteristics of this compound is based on the purity of the powder and the optical quality of the single crystal grown by the Bridgman technique. After comparing the structural information, without wishing to be limited by theory, it is postulated the unique axial symmetry of sorohalides (either rhombohedral or hexagonal structure) might benefit for energy transfer from the excited states in the host material to activator centers.

A skilled artisan would understand that the scintillators of the invention can be formed by any useful process. For example and without limitation, it is conceivable to prepare these sorohalide compounds by slow evaporation from a hydrobromic acid. In this process, for example, high purity $CsBr$, $GdBr_3$, and $CeBr_3$ can be dissolved in HBr solution. Then, the resultant solution can be dried and coated on a substrate under mild heating in a vacuum or in an inert atmosphere. Other non-limiting examples for synthesis are described herein. Thus, a skilled artisan would understand that the sorohalides of the invention can be obtained by any useful synthesis (e.g., any synthetic procedure described herein, including modifications or optimizations thereof).

Example 2

Characterization of Sorohalide Scintillator Including $Cs_3Gd_2Br_9$

After synthesis, we conducted further studies to characterize the sorohalide scintillator. In particular, we observed enhanced light emission for the sorohalide compound, as well as characterized its excitation spectra, emission spectra, and lifetime components. The specific new compound that has been characterized and demonstrated is a cerium ($Ce^{3+}$) doped sorohalide $Cs_3Gd_2Br_9$ (i.e., $Cs_3Gd_{1.9}Ce_{0.1}Br_9$). Details are provided below.

As can be seen, the exemplary sorohalide displayed enhanced light emission, as compared to other scintillators (FIG. 1). In this figure, a known scintillator (CsI:Na) is provided on the far left, and the exemplary sorohalide is provided on the far right. Under UV excitation, $Cs_3Gd_{1.9}Ce_{0.1}Br_9$ emitted a broad light spectrum (white). As compared with elpasolite $Cs_2NaGd_{0.95}Ce_{0.05}Br_6$, the photoluminescence responses of sorohalide compound $Cs_3Gd_{1.9}Ce_{0.1}Br_9$ provided a shift in overall emission from purple to white.

Figure 3:
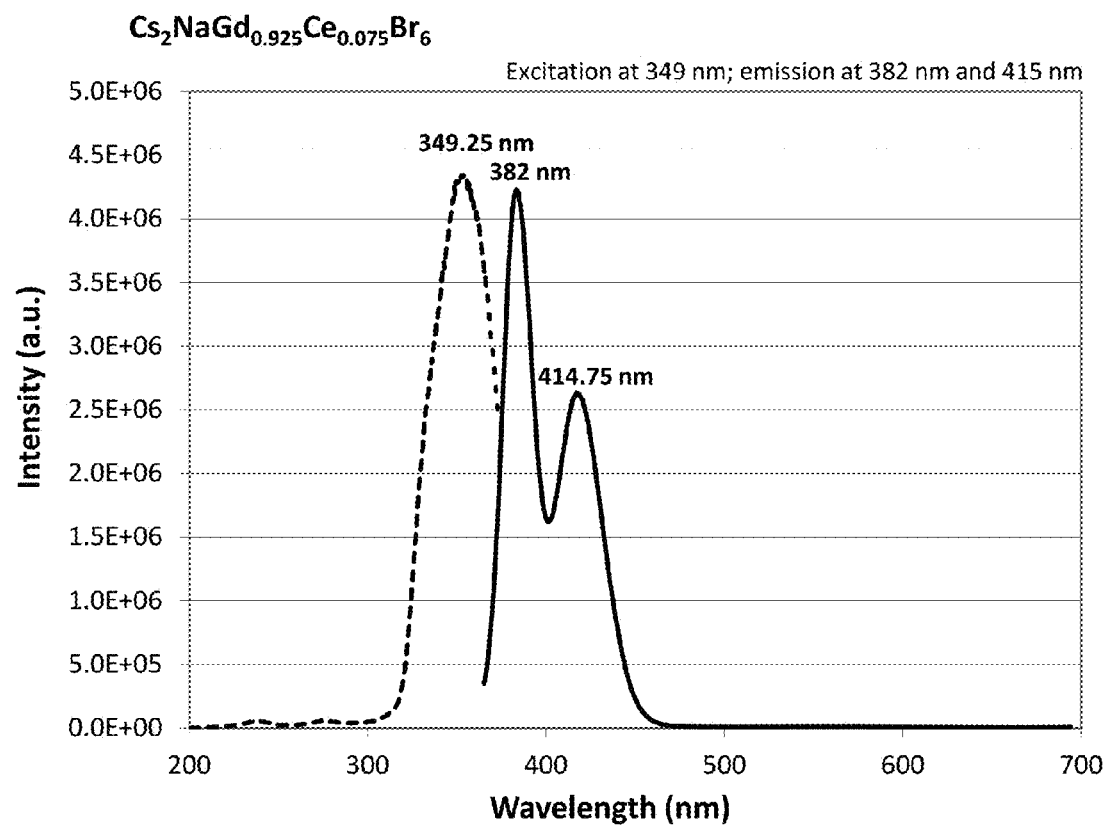
FIG. 3 shows photoluminescence response for the $Cs_2NaGdCeBr_6$ elpasolite scintillator, where excitation and emission peaks are shown.

The exemplary sorohalide also emitted broad spectra with peaks that have not been previously observed for an elpasolite material. FIG. 2 provides optical excitation and emission spectra for an exemplary sorohalide scintillator. As can be seen, the photoluminescence response of the $Cs_3Gd_2Br_9$ sorohalide (FIG. 2) is better than that shown for the $Cs_2NaGdBr_6:Ce^{3+}$ elpasolite (FIG. 3). For instance, pure $Cs_3Gd_2Br_9$ exhibits one broad optical emission peak that covers most of the visible spectrum (at about 499 nm in FIG. 2). In contrast, $Cs_2NaGdBr_6:Ce^{3+}$ exhibits two optical emission peaks that are concentrated in the deep purple region (about 382 nm and 415 nm in FIG. 3).

Figure 5:
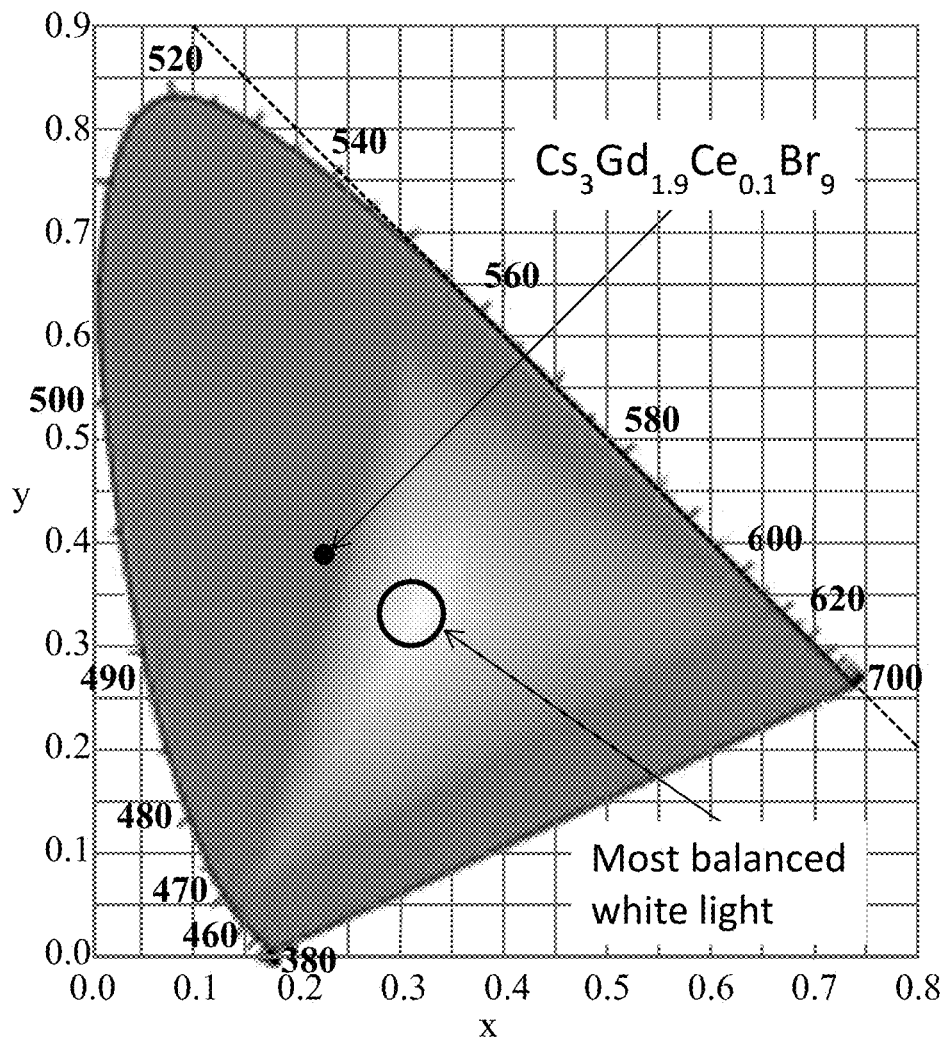
FIG. 5 shows a chromaticity diagram for the $Ce^{3+}$-doped $Cs_3Gd_2Br_9$ sorohalide compound ($Cs_3Gd_{1.9}Ce_{0.1}Br_9$).

For this elpasolite with the $Ce^{3+}$ dopant, the excitation spectra only showed a weak peak at about 275 nm and a strong broad peak at about 349 nm. The elpasolite without the $Ce^{3+}$ dopant exhibits slightly different excitation and emission spectra, as compared to the doped elpasolite. For instance, the undoped $Cs_2NaGdBr_6$ elpasolite exhibits a small excitation peak at about 214 nm, no 244 peak, a medium excitation peak at about 278 nm, and strong excitation peaks at about 346 nm and 367 nm. The undoped $Cs_2NaGdBr_6$ elpasolite exhibits only one emission peak at 427 nm. Thus, as compared to either the doped or undoped $Cs_2NaGdBr_6$ elpasolite, the exemplary sorohalide $Cs_3Gd_{1.9}Ce_{0.1}Br_9$ exhibits an optical emission peak at about 499 nm and a shift in overall emission from purple to white (see FIG. 5, which shows the chromaticity diagram for sorohalide $Cs_3Gd_{1.9}Ce_{0.1}Br_9$ having coordinates at (0.237, 0.394)). In some embodiments, the crystal includes one or more dopants (e.g., Eu, including $Eu^{2+}$) to enhance the red emission to balance the light quality (chromaticity) as close to the sunlight as possible (i.e., close to the white light coordinate (0.313, 0.329) on the chromaticity chart). As compared to the typical $Ce^{3+}$-activated spectra (i.e., emission at 382 nm and 415 nm), the sorohalide exhibited an intense broad optical emission peaked at about 499 nm, which extends from about 400 nm to almost about 700 nm. This emission provided increased light yield in the visible spectra, as compared to conventional $Ce^{3+}$-activated scintillators, which will enhance the detection sensitivity and potentially boost the energy. Accordingly, FIGS. 2 and 5 suggest that the sorohalides of the invention can be useful for white light phosphor applications (e.g., for solid-state lighting).

Figure 4:
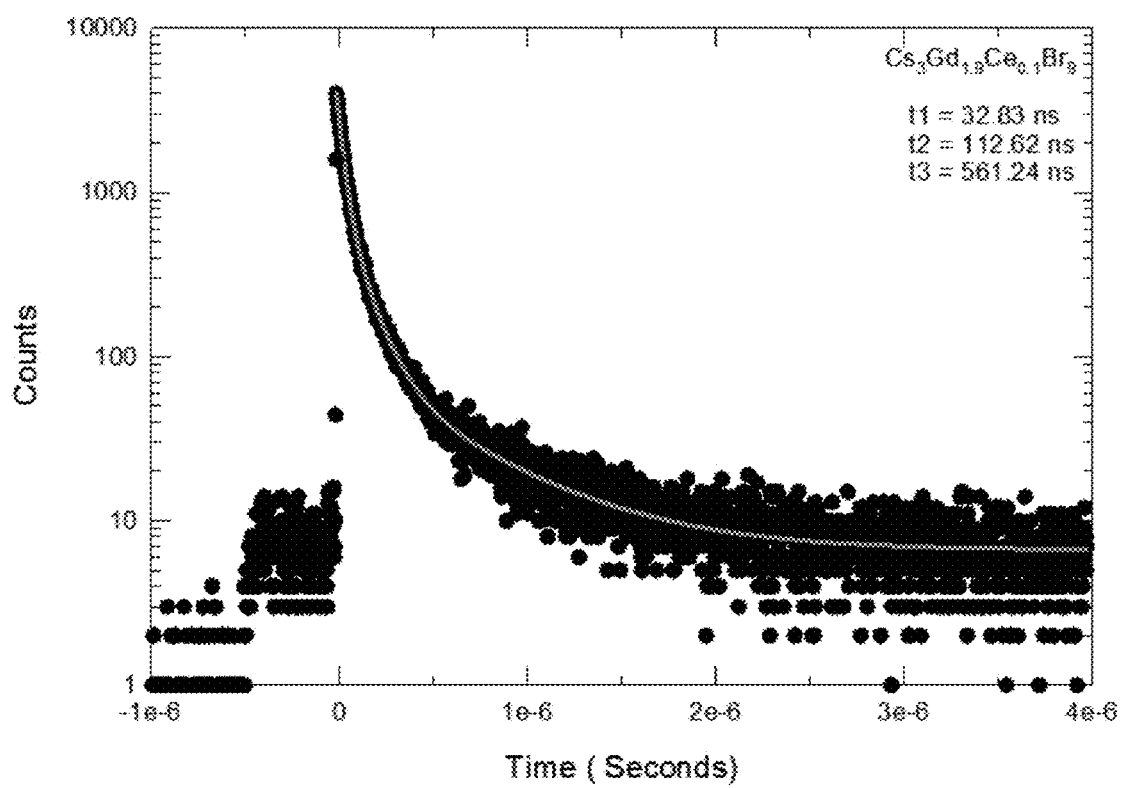
FIG. 4 shows that the new $Cs_3GdBr_9$ compound has three lifetime components ($t_1$=32.83 ns, $t_2$=112.62 ns, and $t_3$=561.24 ns), as being ionized by proton ion beam of 2.5 MeV.

In addition, the lifetime components of the exemplary sorohalide were characterized. As seen in FIG. 4, the short lifetime for this compound makes it suitable for radiation detection applications. The lifetime of the sorohalide included components in the nanosecond (ns) regime, including a fast component of about 33 ns, an intermediate component of about 113 ns, and a slow component of about 561 ns, which is suitable for many detection applications. For instance, traditional workhorse scintillators have the following lifetimes: NaI:Tl (about 250 ns), CsI:Tl (about 1000 ns), and CsI:Na (about 630 ns). Without wishing to be limited by mechanism, the dominant fast component helps to minimize signal pile-up for fast detector applications.

Figure 6:
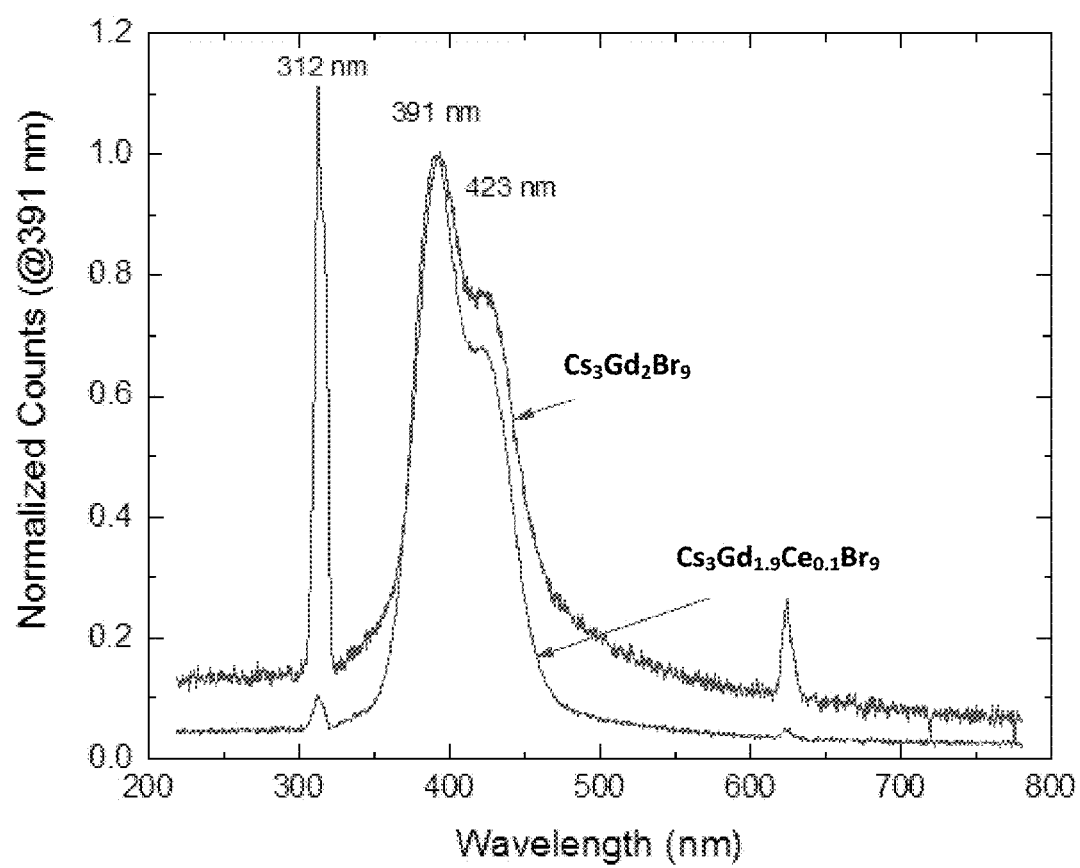
FIG. 6 shows ionization excitation induced emission spectra by electron beam for the undoped and $Ce^{3+}$-doped $Cs_3Gd_2Br_9$ sorohalide. The data were collected by cathodoluminescence measurement at 10 keV. As can be seen, this figure shows that both intrinsic (i.e., undoped) and doped sorohalides can be used as radiation detectors (e.g., for scintillators and/or for x-ray applications). Note the ionization emission provided in FIG. 6 (e.g., for use in scintillation and radiation detection applications) is different from the photoexcited emission provided in FIG. 2 (e.g., for use in phosphor applications).

The sorohalides were also characterized by radioluminescence analysis. FIG. 6 shows ionization excitation induced emission spectra by electron beam for the undoped and $Ce^{3+}$-doped $Cs_3Gd_2Br_9$ sorohalide. As can be seen, this figure shows that both intrinsic (i.e., undoped) and doped sorohalides can be used as radiation detectors (e.g., for scintillators and/or for x-ray applications).

Overall, the $Ce^{3+}$-doped sorohalide $Cs_3Gd_2Br_6$ showed a broadband emission spectrum (from about 400 nm to 700 nm with a sufficient red contribution) and an outstanding optical quantum yield (about 91 to 94%). A skilled artisan would be able to further optimize the chemical composition and refine the processing technique for the sorohalides of the invention (e.g., to optimize the emission spectrum, to further enhance red emission (e.g., by using a dopant, such as any described herein, such as $Eu^2$), and/or to increase optical quantum yield, such as by using any methods described herein). These characteristics have outperformed commercial phosphors that are currently used in phosphor-converted white light-emitting diodes (pc-WLEDs) employing mixed phosphors (by compensating the red deficiency) or co-activated phosphors (by using energy transfer).

In addition, this new sorohalide compound with high optical quantum efficiency could be particularly beneficial for radiation detection and solid-state lighting applications. Accordingly, the present invention encompasses sorohalide compounds having enhanced performance and/or efficiency.

OTHER EMBODIMENTS

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A solid-state light source comprising:
   a radiation source configured to emit radiation having at least one wavelength from about 200 nm to about 500 nm; and
   a scintillation material of formula $A_3B_{2-i}X_9:D_i$, wherein A is an alkali metal, B is a rare earth metal, X is a halogen, and D is a dopant; wherein $0 \leq i < 2$; and wherein B and D are different.

2. The light source of claim 1, wherein the material has formula $A_3B_{2-i}X_9:D_i$ and wherein $0.01 \leq i < 2$.

3. The light source of claim 2, wherein D is selected from the group consisting of Ce, Eu, Yb, Mn, Ca, Sr, Ba, Sc, Y, Zr, Hf, Zn, Tl, Ag, Cd, Al, Ga, In, and Sn.

4. The light source of claim 3, wherein the material has formula $A_3Gd_{2-i}X_9:D_i$.

5. The light source of claim 4, wherein the material has formula $Cs_3Gd_{2-i}Br_9:D_i$ or formula $Rb_3Gd_{2-i}Br_9:D_i$.

6. The light source of claim 2, wherein the material has formula $A_3Gd_{2-i}X_9:Ce_i$.

7. The light source of claim 2, wherein the material has formula $A_3Sc_{2-i}X_9:D_i$.

8. The light source of claim 2, wherein the material has formula $A_3Y_{2-i}X_9:D_i$.

9. The light source of claim 2, wherein $0.1 \leq i < 1.95$.

10. The light source of claim 2, further comprising a co-dopant.

11. The light source of claim 2, wherein the material is in monocrystalline form, polycrystalline form, powder form, small crystal form, or large single crystal form.

12. The light source of claim 1, wherein the scintillation material has formula $A_3Gd_{2-i}Br_9:D_i$.

13. The light source of claim 1, wherein the scintillation material has formula $Cs_3Gd_{2-i}Br_9:Ce_i$ and wherein $0.1 \leq i < 1.95$.

14. The light source of claim 1, wherein the scintillation material has formula $Cs_3Gd_2Br_9$.

15. The light source of claim 1, wherein B is Gd, Sc, or Y.

16. The light source of claim 1, wherein A is Cs or Rb.

17. The light source of claim 1, wherein the light source is a white light-emitting diode.

18. The light source of claim 1, wherein the radiation source is a UV or near UV light-emitting diode.

19. The light source of claim 1, wherein the radiation source is configured to emit radiation having at least one wavelength from about 250 nm to about 410 nm.

20. The light source of claim 1, wherein the radiation source comprises a UV diode.

21. A method for preparing a scintillation material, the method comprising solution-based synthesis, thereby preparing the scintillation material of formula $A_3B_{2-i}X_9:D_i$, wherein A is an alkali metal, B is a rare earth metal, X is a halogen, and D is a dopant; wherein $0 \leq i < 2$; and wherein B and D are different,
   wherein the method comprises:
   i) dissolving a rare earth metal halide salt $BX_3$ and an alkali metal AX in HX to form a solution, wherein the rare earth metal halide salt and the alkali metal can be dissolved consecutively in any order or at the same time;
   ii) dissolving dopant complex $DX_3$ in the solution;
   iii) evaporating the solution, thereby forming one or more hydrated crystals; and
   iv) dehydrating the hydrated crystals to a treatment temperature below about 300° C., thereby forming the scintillation material.

22. The method of claim 21, wherein step i) comprises a stoichiometry ratio of about 3:2 for $AX:BX_3$.

23. The method of claim 21, wherein step iii) comprises slowly heating the HX solution under vacuum and with a cold trap.

24. The method of claim 21, wherein step iv) comprises the treatment temperature at about 250° C. and a duration of at least about 6 hours under vacuum and with a cold trap.

25. The method of claim 21, thereby forming the scintillation material in crystalline phase or in powder form.

26. The method of claim 21, wherein step iv) comprises forming the scintillation material having formula $A_3Gd_{2-i}Br_9:D_i$.

27. The method of claim 21, wherein step iv) comprises forming the scintillation material having formula $Cs_3Gd_{2-i}Br_9:Ce_i$ and wherein $0.1 \leq i < 1.95$.

28. The method of claim 21, wherein step iv) comprises forming the scintillation material having formula $Cs_3Gd_2Br_9$.

29. The method of claim 21, wherein step iv) comprises forming the scintillation material in which B is Gd, Sc, or Y.

30. The method of claim 21, wherein step iv) comprises forming the scintillation material in which A is Cs or Rb.

* * * * *